(12) United States Patent
Singh et al.

(10) Patent No.: US 6,731,849 B1
(45) Date of Patent: May 4, 2004

(54) COATING FOR OPTICAL FIBERS

(75) Inventors: Bawa Singh, Voorhees, NJ (US); Nalin Kumar, Moorestown, NJ (US); Vipulkumar Patel, South Brunswick, NJ (US); Krishna Linga, South Plainsboro, NJ (US); Ali Ouali, Upper Darby, PA (US)

(73) Assignee: LightMatrix Technologies, Inc., Mount Laurel, NJ (US)

( * ) Notice: Subject to any disclaimer, the term of this patent is extended or adjusted under 35 U.S.C. 154(b) by 0 days.

(21) Appl. No.: 10/444,904

(22) Filed: May 22, 2003

Related U.S. Application Data

(62) Division of application No. 09/973,513, filed on Oct. 9, 2001, now Pat. No. 6,620,300.
(60) Provisional application No. 60/293,785, filed on May 25, 2001, and provisional application No. 60/244,239, filed on Oct. 30, 2000.

(51) Int. Cl.$^7$ .................................................. G02B 6/02
(52) U.S. Cl. ..................... 385/128; 385/141; 385/123; 428/392; 427/163.2; 204/192.12

(58) Field of Search ................................ 385/128, 123, 385/141, 125, 126, 124, 127; 428/392, 391; 427/163.2, 165; 204/192.12, 192.13

(56) References Cited

U.S. PATENT DOCUMENTS 5,904,983 A * 5/1999 Chan et al. ............. 385/123 X

* cited by examiner

*Primary Examiner*—Phan T. H. Palmer
(74) *Attorney, Agent, or Firm*—Michael G. Crilly, Esq.

(57) ABSTRACT

An improved coating for optical fibers is described. The present invention is a dimensionally precise and uniform coating with low-porosity. The improved coating is applied via sputtering within a vacuum chamber. Environmental conditions are monitored within a cylindrical magnetron during sputtering. Sputtering is adjusted or temporarily ceased when environmental conditions approach a damage threshold. Sputtered particles within a plasma cloud are dimensionally similar and adhere to an optical fiber in a volume efficient arrangement forming a more precise, denser, and more adherent coating. Embodiments of the present invention provide improved pull strength by compressively constraining the optical fiber within the coating and by closing microcracks.

25 Claims, 6 Drawing Sheets

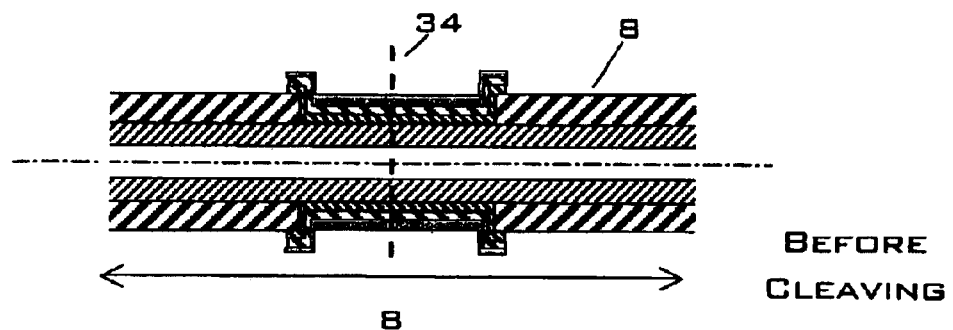
*FIG. 3A*
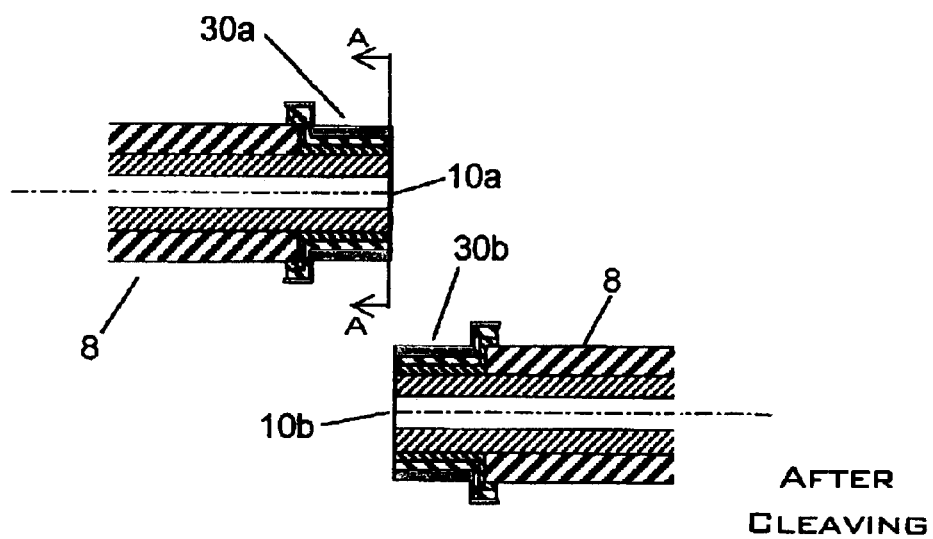
*FIG. 3B*
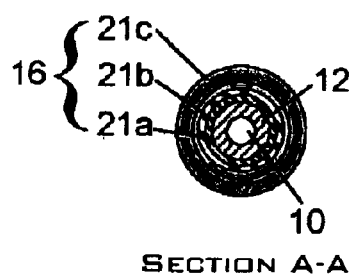
*FIG. 3C*
FIGURE 3

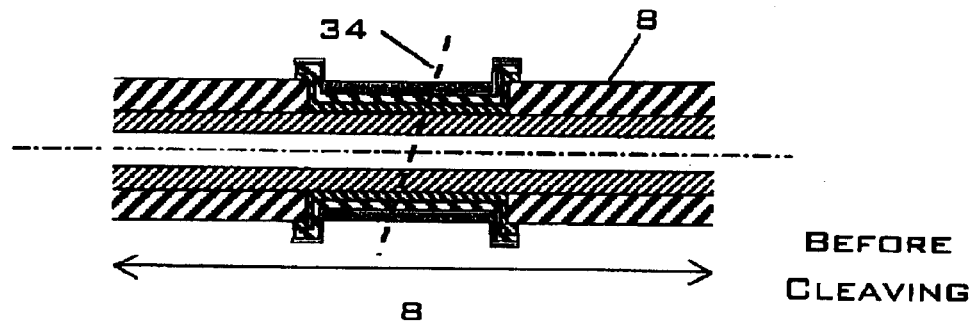
FIG. 4A
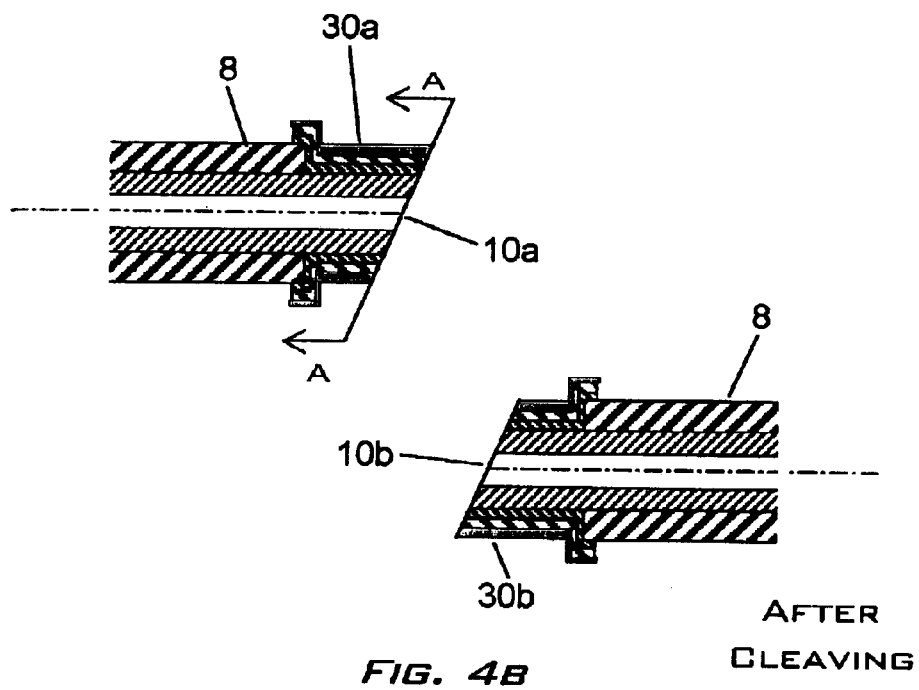
FIG. 4B
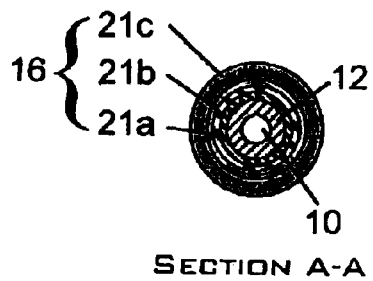
FIG. 4C
FIGURE 4

COATING FOR OPTICAL FIBERS

CROSS-REFERENCE TO RELATED APPLICATIONS

This application is a divisional application of application Ser. No. 09/973,513, now U.S. Pat. No. 6,620,300, filed Oct. 9, 2001, and claims the benefit of U.S. Provisional Applications No. 60/244,239 filed on Oct. 30, 2000 and No. 60/293,785 filed on May 25, 2001. The subject matters of the prior applications are incorporated in their entirety herein by reference thereto.

FEDERALLY SPONSORED RESEARCH OR DEVELOPMENT

None.

BACKGROUND OF THE INVENTION

1. Field of the Invention

The present invention is an improved coating for optical fibers. The coating consists of a densely packed structure of sputtered particles forming a precise, dense, and adherent layer. The coating is deposited within a cylindrical magnetron via a sputtering process that avoids damaging the optical fiber.

2. Description of the Related Art

In recent years, optical fiber technology has gained popularity in many commercial applications due to unparalleled performance advantages over existing metal-wire systems. In particular, optical fibers and related components are widely accepted in military communications, civilian telecommunications, and control systems. Optical fibers are small, strong, and lightweight. In communication applications, they provide wide bandwidth, low transmission loss, resistance to radiation damage, and immunity to electromagnetic interference.

A typical optical fiber is composed of a core within a layer of cladding and thereafter one or more layers of a buffer. The core provides a pathway for light. The cladding confines light to the core. The buffer provides mechanical and environmental protection for both core and cladding.

Fiber construction and materials are known within the art. For example, a typical single-mode fiber (SMF) is composed of precision extruded glass having a cladding with a diameter of 125 $\mu m \pm 2$ $\mu m$ and a core with a diameter of 8 $\mu m \pm 1$ $\mu m$ residing within the center of the cladding. A buffer is typically composed of a flexible polymer applied onto the outer surface of a cladding via known methods yielding dimensional variations at least one magnitude larger than in core and cladding. Existing deposition methods produce a coating with large dimensional variations. Consequently, state-of-the-art optical fibers are composed of a dimensionally precise core and cladding assembly within a less precise buffer and coating. Such imprecisions skew the concentricity between core and coating. As such, commercial optical fibers do not lend themselves to precision alignment. Misalignment between fibers or fiber and optical component (i.e., photodetector) is the primarily source of light energy loss.

Optical fiber systems typically require a hermetic seal at fiber-fiber connections, fiber-component connections, and along the length of a fiber to prevent moisture and other contaminates from degrading the optical pathway. Commercially available coated fibers are porous and therefore fail to provide a hermetic seal sufficient to exploit component lifetime. Furthermore, porous coatings reduce adherence between coating and fiber thereby weakening connections.

Coated optical fibers are typically soldered to other components thereby providing a continuous pathway. The pull strength of the coated fiber at such connections is critical to the integrity of the pathway. Currently, coating design and fabrication methods limit pull strength to approximately 1.6 pounds as verified by quality assurance tests known within the art. Coating methods may also further weaken the fiber by creating micro-cracks within the fiber structure.

It is therefore an object of the present invention to avoid the disadvantages of the related art. More particularly, it is an object of the invention to provide a coated optical fiber with minimal dimensional variability thereby facilitating rapid alignment and assembly of such fibers within an optical system. It is an object of the invention to provide a dense, low-porosity coating onto a fiber substrate. It is an object of the invention to provide improved adherence between coating and fiber substrate. Furthermore, it is an object of the invention to provide a coated fiber with greater pull strength.

SUMMARY OF THE INVENTION

The present invention includes improved coating having single and multiple layer configurations. In one embodiment, at least one layer is composed of a thermal barrier material applied directly onto an optical fiber, a metal layer, or another thermal barrier material. In yet another embodiment, the layers are composed of commercially pure metals.

Coating embodiments facilitate a stronger optical fiber in conventional pull test arrangements. Thermal barrier coatings arc inherently stronger due to their mechanical properties of the materials and improved adherence between such materials and fiber, as well as between such materials and other layer materials. Metal-based coatings are inherently stronger because either the coating compressively constrains the fiber or the coating closes microcracks within the fiber prior to or as a result of the sputtering process.

BRIEF DESCRIPTION OF THE DRAWINGS

FIGS. 3A–3C are cross-section view of fiber mid-section before and after cleaving along plane perpendicular to fiber axis.

FIG. 4A–4C are cross-section view of fiber mid-section before and after cleaving along plane oblique to fiber axis.

REFERENCE NUMERALS

Figure 1:
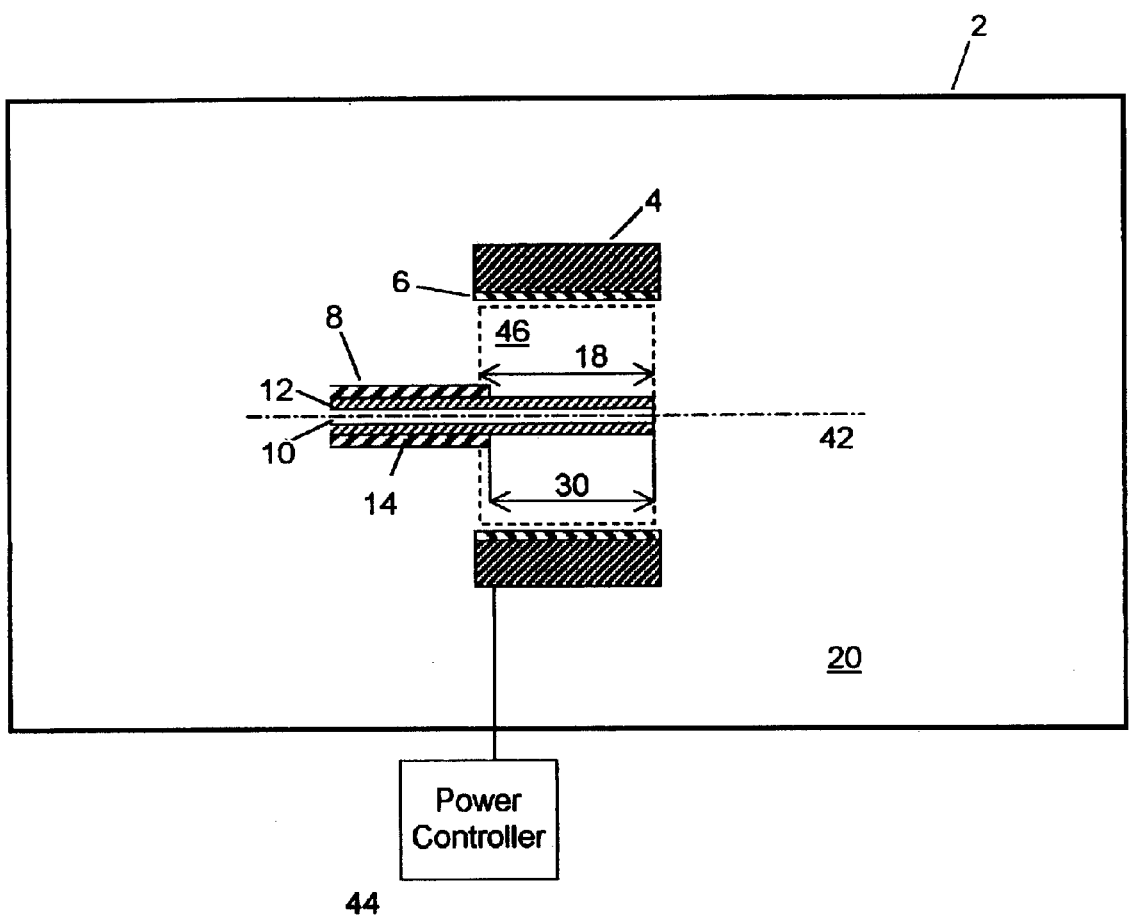
FIG. 1 shows a schematic section view of fiber end within cylindrical magnetron.

2 Vacuum chamber
4 Cylindrical magnetron
6 Hollow cathode
8 Optical fiber
10 Core
12 Cladding
14 Buffer 16 Coating
18 Fiber segment
20 Chamber environment
21 Layer
30 Fiber end
32 Fiber mid-section
34 Cleave plane
36 Environmental sensor
38 Sputtered particles
40 Columnar microstructure
42 Longitudinal axis
44 Power controller
46 Plasma cloud.
48 Fixture
54 Sensor controller

DETAILED DESCRIPTION OF THE INVENTION

Figure 2:
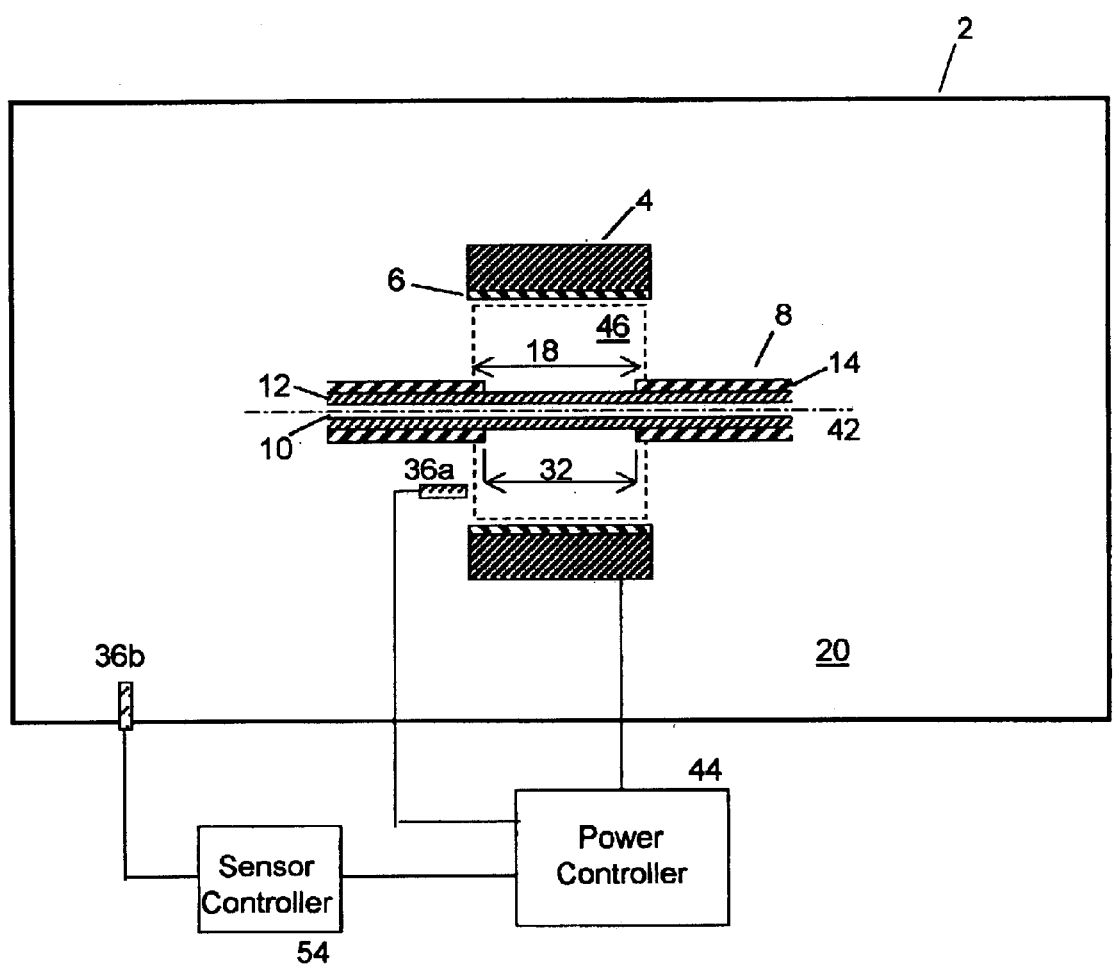
FIG. 2 shows a schematic section view of fiber mid-section within cylindrical magnetron.
Figure 5:
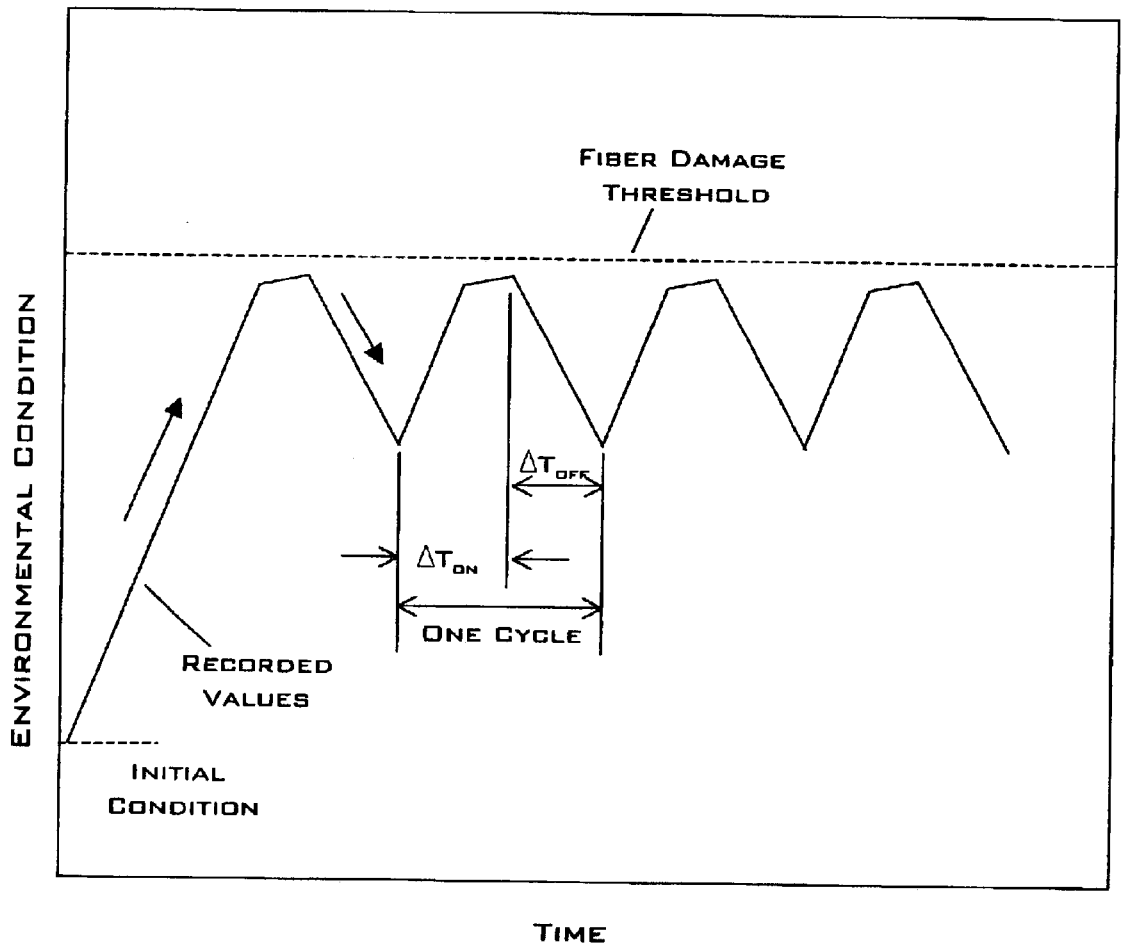
FIG. 5 shows an exemplary environmental history plot facilitating damage free sputtering.
Figure 6:
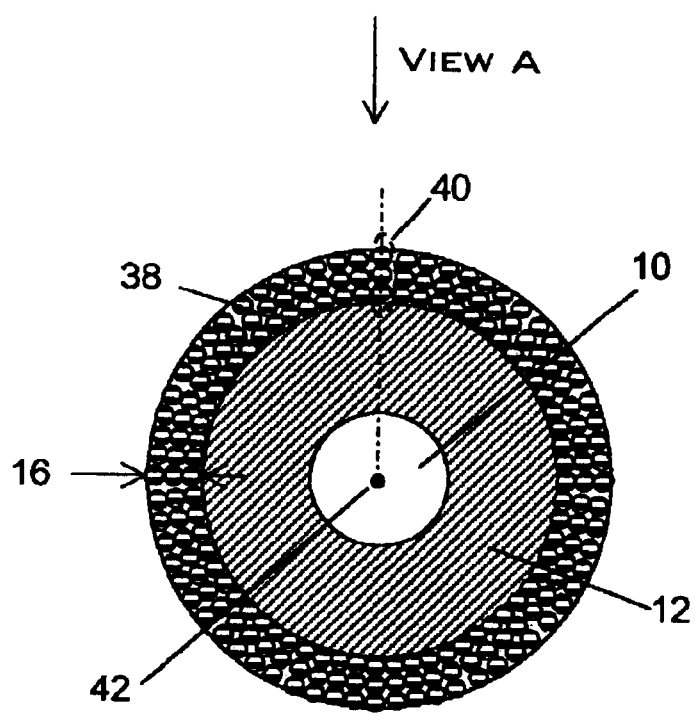
FIG. 6 shows a graphical representation of coating structure with sputtered particles aligned about a fiber cross section.
Figure 7:
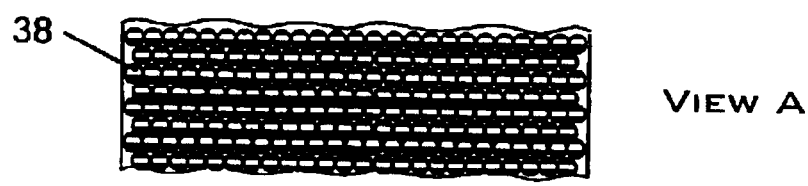
FIG. 7 is a top view of optical fiber showing sputtered particle arrangement.

FIGS. 1 through 7 describe various features supporting the claimed apparatus. FIGS. 1 and 2 include hardware and apparatus arrangements relevant to the deposition process. FIGS. 3 and 4 describe fiber ends 30 achieved after cleaving. FIG. 5 describes environmental control during the deposition method. FIGS. 6 and 7 graphically describe the columnar microstructure 40 typical of coatings 16. Component dimensions are not to scale. Optical fibers 8 with circular cross sections are presented and described. However, the claimed invention is not limited to this form The preferred deposition method to produce the present invention includes generating a plasma cloud 46 composed of dimensionally similar sputtered particles 38 that adhere to an optical fiber 8 and form a uniform, adherent, low-porosity coating 16, monitoring at least one environmental parameter within the vacuum chamber 2 during the process, and adjusting the deposition step to avoid one or more conditions that promote damage to the optical fiber 8. The deposition method is applicable to fiber ends 30, fiber mid-sections 32, as well as along the length of the optical fiber 8. An optional cleaving step is available. For example, a portion of the fiber end 30 is removed to expose an optically clear core 10 after residue and debris from the cleaving step are removed. In another example, the fiber mid-section 32 is cleaved yielding two fiber ends 30, each having an optically clear core 10 after residue and debris from the cleaving step are removed.

Pre-deposition cleaning is sometimes required to prepare optical fiber 8 and hollow cathode 6. All or some of the buffer 14 is removed from the optical fiber 8 along a fiber segment 18 onto which coating 16 is to be deposited. Removal of buffer 14 and cladding 12 may be achieved by mechanical or chemical methods or combinations thereof. For example, mechanical stripping devices known within the art are well suited to removing buffer 14. Chemical etching methods known within the art, one example including an acid bath, are applicable to removing buffer 14 and/or cladding 12. The optical fiber 8 is cleaned using techniques known within the art to remove any residues remaining along the exposed cladding 12 or core 10. Next, the fiber segment 18 is positioned within the cylindrical magnetron 4. FIG. 1 shows a fiber end 30 within a cylindrical magnetron 4 prior to deposition. FIG. 2 shows a fiber mid-section 32 within a cylindrical magnetron 4 before deposition.

Pre-deposition cleaning of the fiber segment 18 within the cylindrical magnetron 4 may also be desired. The cylindrical magnetron 4 without hollow cathode 6 is energized with either RF voltage in the presence of a chamber environment 20 consisting mainly of oxygen. The resultant reactive species generated within the vacuum chamber 2 removes organic compounds, buffer 14, and cladding 12, where desired, from the optical fiber 8.

Hollow cathodes 6 also require cleaning to remove oxides, residues, and organic materials that contaminate and weaken the bond between coating 16 and fiber segment 18. A cylindrical magnetron 4 is energized with hollow cathode 6, prior to insertion of an optical fiber 8, thereby forming a plasma cloud 46. Thereafter, the cylindrical magnetron 4 is de-energized and the plasma cloud 46 dissipated. The hollow cathode 6 may require energizing and de-energizing several times to adequately remove contaminants.

Function of the hollow cathode 6 is adjusted during the deposition process to avoid conditions exceeding one or more established fiber damage thresholds, examples including but not limited to pressure, temperature, and gas species. Both interactive and active control of the hollow cathode 6 are possible.

In the interactive mode, a user controls the cylindrical magnetron 4 by sequentially switching power ON and OFF for defined durations via a power controller 44 shown in FIG. 1. A single pair of ON-OFF switching and corresponding energizing and de-energizng constitute a cycle. Cycle characteristics may be determined experimentally. FIG. 5 describes an exemplary graphical map for an experimentally characterized environmental parameter. Experimental characterization may be performed by recording temperature versus time within a cylindrical magnetron 4 over a range of pressures, temperatures, and gas flow rates. When the cylindrical magnetron 4 is energized for a specified time increment ($\Delta T_{on}$), one or more measured environmental parameters approach their corresponding damage thresholds, above which the optical fiber 8 is damaged and the quality of the coating 16 is diminished. For example, a typical single-mode optical fiber 8 has a damage threshold temperature around 120 degrees Celsius maintained for approximately twenty seconds. The cylindrical magnetron 4 is de-energized for a specified time increment ($\Delta T_{off}$) allowing the environmental parameter to recede. A plurality of cycles may be required to achieve the desired coating 16.

In the active mode, one or more environmental sensors 36a, 36b are placed within the vacuum chamber 2 sometimes positioned immediately adjacent to the cylindrical magnetron 4, as shown in FIG. 2. A typical environmental sensor 36a, 36b records parameter data, examples including pressure, temperature, and gas species, indicative of the physical condition of the optical fiber 8. Environmental sensors 36a, 36b include thermocouples, radiometers, optical pyrometers, pressure transducers, and residual gas analyzers (RGA). The environmental sensor 36a, 36b communicates with a power controller 44 directly thereby providing data required to adjust power to the cylindrical magnetron 4. Alternatively, the environmental sensor 36a, 36b may send raw data to a sensor controller 54 for processing after which it is sent to a power controller 44. The power controller 44 might continuously adjust power magnitude between ON and OFF states or simply switch between the two states, as represented in FIG. 5.

Coating 16 thickness is controlled by deposition rate and total exposure time within the cylindrical magnetron 4. Coating 16 material is voltage type dependent. For example, DC voltage facilitates the formation of conductive coatings 16, including but not limited to nickel, aluminum, and gold. RF voltage facilitates the formation of metal, insulating, and dielectric coatings 16, including but are not limited to PTFE, carbon, and diamond-like thin films. Multiple layer 21 coatings 16 are achieved by successive deposition steps applying one or more materials.

Coatings 16 composed of a single layer 21 include both metals and non-metals. Preferred single layer 21 materials include aluminum, silver, gold, chromium, copper, nickel, palladium, platinum, titanium, tantalum, tungsten, nickel-chromiun alloys, titanium-chromium alloys, and thermal barrier materials preferably providing a diffusion barrier. Specific thermal barrier materials include nitrides, oxides, carbides, and oxy-nitrides. Nitride-based coatings 16 include but are not limited to titanium nitrides, zirconium nitrides, carbon nitrides, aluminum nitrides, hafnium nitrides, chromium nitrides, and tantalum nitrides. Oxide-based coatings 16 include but are not limited to titanium oxides, zirconium oxides, aluminum oxides, hafnium oxides, chromium oxides, and tantalum oxides. Carbide-based coatings 16 include but are not limited to titanium carbides, zirconium carbides, aluminum carbide, hafnium carbide, chromium carbide, and tantalum carbide. Oxy-nitride-based coatings 16 include $M_yO_xN_{1-x}$, where $0<x<1$, $y>0$, and M is a metal.

Coatings 16 may be composed of two or more layers 21. Preferred embodiments have at least one layer 21 composed of a thermal barrier, preferably a nitride, carbide, oxide, or oxy-nitride, examples as described above. In the preferred embodiment, the thermal barrier material should have a coefficient of thermal expansion comparable to adjacent layers 21. FIG. 3c shows a three layer 21a, 21b, 21c system. In preferred embodiments, a first layer 21a forms an adhesive bond with the optical fiber 8, a second layer 21b provides a diffusion barrier, and a third layer 21c forms an oxidation resistant film. First layer 21a materials include titanium, nickel, aluminum, nickel-chromium, tantalum, titanium-tungsten, chromium and nickel-chromium alloys. The second layer 21b may consist of one or more sequentially applied thin films composed of materials including oxides, nitrides, carbides, oxy-nitrides, and combinations thereof. The third layer 21c may, consist of a precious metal and alloys thereof. The third layer 21c may possess a low-melt temperature to facilitate soldering thereby providing a hermetic seal between two or more optical fibers 8 or one or more optical fibers 8 and one or more components, example materials including such eutectic solders as gold-tin, silver-tin, indium-tin, and lead-tin.

Coatings 16 composed of two or more layers 21 as described above increase the pull or break strength of the optical fiber 8. For example, three layer 21a, 21b, 21c systems as described above compressively strain the underlying fiber segment 18 thereby increasing the tensile failure threshold of the optical fiber 8. Such three layer 21a, 21b, 21c systems also seal micro-cracks along the surface of the optical fiber 8, core 10, or cladding 12 and thereby resist crack-based failures from propagating through the optical fiber 8.

Chamber environment 20, namely pressure and gas flow rate, and power to the cylindrical magnetron 4 are dependent on the size of and the material comprising the hollow cathode 6. For example, a cylindrical magnetron 4 with a 50.8 mm inner diameter, 76.2 mm long, and 55.6 mm long magnets has an operating range of 5 to 50 watts at a gas pressure of 2 to 50 milliTorr. Gas flow rate maintains the desired pressure within the vacuum chamber 2 and therefore is dependent on the construction of the vacuum chamber 2. Titanium deposition is achieved when the chamber pressure is between 2 and 20 milliTorr, argon flow rate is between 50 and 200 sccm, and power is between 10 and 25 Watts. Platinum deposition is achieved when the chamber pressure is between 10 and 30 mTorr, argon flow rate is between 50 and 200 sccm, and power is between 10 and 25 Watts. Nickel deposition is achieved when the chamber pressure is between 10 and 30 mTorr, argon flow rate is between 50 and 200 sccm, and power is between 15 and 25 Watts. Gold deposition is achieved when the chamber pressure is between 10 and 30 mTorr, argon flow rate is between 50 and 200 sccm and power is between 10 and 25 Watts. Power fluctuations should be minimized to less than ±1% of the total power input to the cylindrical magnetron 4, otherwise coating 16 uniformity is compromised by the formation of dimensionally dissimilar sputtered particles 38. Deposition times less than one minute with one minute cool down intervals avoid overheating of the optical fiber 8.

The plasma cloud 46 is optimum when it glows with a bright, crisp uniform color surrounding the optical fiber 8. For example, an optimized plasma cloud 46 is white when the vacuum chamber 2 contains argon gas and pink when oxygen fills the vacuum chamber 2.

After deposition is completed, the optical fiber 8 may be cleaved and cleaned to yield a single optically clear core 10 when coating 16 is applied to the fiber end 30 or to yield two optically clear cores 10a, 10b attached to an equal number of fiber ends 30a, 30b when coating 16 is applied to a fiber mid-section 32. Cleaning many include mechanical or chemical methods known within the art. FIG. 3 shows an optical fiber 8 with coating 16 applied to the fiber mid-section 32 before and after cleaving. In this embodiment, the cleave plane 34 bisects the fiber segment 18 perpendicular to the longitudinal axis 42 of the optical fiber 8. FIG. 4 shows an alternate embodiment wherein the cleave plane 34 bisects the fiber segment 18 oblique to the longitudinal axis 42.

Denser, less porous coatings 16 result when dimensionally similar sputtered particles 38 are densely packed within a given volume. FIGS. 6 and 7 show one such example of a plurality of dimensionally similar sputtered particles 38 arranged in a columnar microstructure 40 surrounding and attached to a singles optical fiber 8. The sputtered particles 38 are aligned in a row with respect to radial lines projected from the longitudinal axis 42 of the optical fiber 8. FIG. 7 shows the interlocking arrangement between sputtered particles 38 when viewed along the length of the optical fiber 8. In preferred embodiments, pull strength of the coating 16 is at least 2 pounds.

Sputtered particles 38 adhere to the optical fiber 8 in a volumetric efficient arrangement thereby maximizing density and minimizing porosity. Sputtered particles 38 either adhere to one another or coalesce forming a continuous layer 21. Sputtered particles 38 align and pack forming various arrangements. For example, titanium and nickel adhere to an optical fiber 8 and form a columnar microstructure 40.

FIGS. 3b and 4b show representative optical fibers 8 with a single coating 16 comprised of multiple layers 21. Coating 16 dimensions, namely length and thickness, are application dependent. Coatings 16 are best characterized as a uniform cylinder of material with minimal dimensional variations surrounding and bonded to an optical fiber 8. A coating 16 may be applied to a fiber end 30, a single fiber segment 18, multiple fiber segments 18, along the length of an optical fiber 8, and combinations thereof. Thickness uniformity insures concentricity between cladding 12 and coating 16 at least as good as that between cladding 12 and core 10. Dimensional precision of the coating 16 increases inversely with the diameter of the sputtered particles 38 and improves with decreasing variation in the sputtered particles 38.

The described coating 16 yields a stronger optical fiber 8 when subjected to pull tests known within the art. Preferred embodiments of the coating 16 improving the optical fiber 8 strength consist of a plurality of layers 21 composed of commercially pure metals. A specific example includes a three layer 21a, 21b, 21c configuration wherein 500 Angstroms thick titanium is bonded to the optical fiber 8, 1000 Angstroms thick nickel is bonded to the titanium, and 500 angstroms thick gold is bonded to the nickel. Another specific example includes a three layer 21a, 21b, 21c configuration wherein 500 Angstroms thick titanium is bonded to the optical fiber 8, 1000 Angstroms thick platinum is bonded to the titanium, and 500 angstroms thick gold is bonded to the platinum.

Two mechanism are responsible for improved strength in some embodiments, the coating 16 surrounding the optical fiber 8 effectively closes micro-cracks within the cladding 12 of the optical fiber 8 prior to or formed during sputtering. Closing includes bridging, filling, or locally pulling the crack together thereby eliminating the crack. In 22 alternate embodiments, the applied coating 16 is under a compressive strain that prevents failure along cracks within the optical fiber 8. Compressive forces are uniaxial or multi-axial along both axial and radial components of the optical fiber 8.

The description above indicates that a great degree of flexibility is offered by the described invention. Although the present invention has been described in considerable detail with reference to certain preferred versions thereof, other versions are possible. Therefore, the spirit and scope of the appended claims should not be limited to the description of the preferred versions contained herein.

What is claimed is:

1. An adherent coating for an optical fiber with improved pull strength comprising a plurality of layers, said layers sputtered onto said optical fiber, said coating covering at least one flaw along said optic fiber.

2. An improved coating for an optical fiber comprising a thermal barrier material, said coating having a pull strength of at least 2 pounds.

3. An adherent coating for an optical fiber with improved pull strength comprising a plurality of layers, said layers sputtered onto said optical fiber, said coating forming a compressively strained cover along said optical fiber.

4. An improved coating for an optical fiber comprising a plurality of layers wherein at least one of said layers is a thermal barrier material, said coating having a pull strength of at least 2 pounds.

5. An improved coating for an optical fiber comprising a plurality of layers wherein at least one of said layers is a thermal barrier material, said coating has a first layer composed of a metal bonding to said optical fiber, a second layer composed of a thermal barrier material bonding to said first layer, and a third layer composed of an oxidation resistive metal bonding to said second layer.

6. The improved coating of claim 5, wherein said second layer is a metal oxide, a metal nitride, a metal carbide, a metal oxy-nitride, or combinations thereof.

7. The improved coating of claim 6, wherein said metal oxy-nitride is $M_yO_xN_{1-x}$, where M is a metal, $0<x<1$, and $y>0$.

8. The improved coating of claim 7, wherein said coating having a pull strength of at least 2 pounds.

9. The improved coating of claim 6, wherein said second layer is comprised of a plurality of thin films.

10. The improved coating of claim 9, wherein said coating having a pull strength of at least 2 pounds.

11. The improved coating of claim 6, wherein said coating having a pull strength of at least 2 pounds.

12. The improved coating of claim 5, wherein said third layer is composed of a metal-tin alloy.

13. The improved coating of claim 12, wherein said metal is gold, silver, indium, or lead.

14. The improved coating of claim 13, wherein said coating having a pull strength of at least 2 pounds.

15. The improved coating of claim 12, wherein said coating having a pull strength of at least 2 pounds.

16. The improved coating of claim 5, wherein said first layer is aluminum, nickel, titanium, nickel-chromium alloy, chromium, titanium-tungsten alloy, tantalum, or combinations thereof.

17. The improved coating of claim 16, wherein said coating having a pull strength of at least 2 pounds.

18. The improved coating of claim 5, wherein said first layer has a columnar microstrucure.

19. The improved coating of claim 18, wherein said coating having a pull strength of at least 2 pounds.

20. The improved coating of claim 5, wherein said third layer is composed of a precious metal.

21. The improved coating of claim 20, wherein said coating having a pull strength of at least 2 pounds.

22. The improved coating of claim 5, wherein said coating having a pull strength of at least 2 pounds.

23. An adherent coating for an optical fiber with improved pull strength comprising a plurality of layers, said layers sputtered onto said optical fiber, said layers composed of at least one commercially pure metal, said coating having a pull strength of at least 2 pounds.

24. The adherent coating of claim 23, wherein said layers include a first layer composed of 500 Angstroms thick titanium bonded to said optical fiber, a second layer composed of 1000 Angstroms thick platinum bonded to said first layer, a third layer composed of 500 Angstroms thick gold bonded to said second layer.

25. The adherent coating of claim 23, wherein said layers include a first layer composed of 500 Angstroms thick titanium bonded to said optical fiber, a second layer composed of 1000 Angstroms thick nickel bonded to said first layer, a third layer composed of 500 Angstroms thick gold bonded to said second layer.

* * * * *